(12) United States Patent
Webb et al.

(10) Patent No.: US 12,431,329 B2
(45) Date of Patent: Sep. 30, 2025

(54) METHOD OF ASSEMBLING DRIFT TUBE ASSEMBLIES IN ION IMPLANTORS

(71) Applicant: Applied Materials, Inc., Santa Clara, CA (US)

(72) Inventors: Aaron P. Webb, Austin, TX (US); Krag R. Senior, Austin, TX (US); Chris Czajka, Dripping Springs, TX (US); Charles T. Carlson, Cedar Park, TX (US); Jason M. Schaller, Austin, TX (US)

(73) Assignee: Applied Materials, Inc.

( * ) Notice: Subject to any disclaimer, the term of this patent is extended or adjusted under 35 U.S.C. 154(b) by 369 days.

(21) Appl. No.: 18/210,524

(22) Filed: Jun. 15, 2023

(65) Prior Publication Data

US 2024/0420919 A1 Dec. 19, 2024

(51) Int. Cl.
*H01J 37/30* (2006.01)
*H01J 37/317* (2006.01)
*H05H 9/04* (2006.01)

(52) U.S. Cl.
CPC ...... *H01J 37/3007* (2013.01); *H01J 37/3171* (2013.01); *H05H 9/042* (2013.01); *H01J 2237/08* (2013.01); *H05H 2277/12* (2013.01)

(58) Field of Classification Search
CPC .............. H01J 37/3007; H01J 37/3171; H01J 2237/08; H05H 9/042; H05H 2277/12
USPC .................................................. 250/281, 282
See application file for complete search history.

(56) References Cited

U.S. PATENT DOCUMENTS

2023/0120769 A1* 4/2023 Blahnik ................... H05H 7/22
315/505

* cited by examiner

*Primary Examiner* — Michael Maskell
(74) *Attorney, Agent, or Firm* — KDW Firm PLLC

(57) ABSTRACT

An ion implantation system including an ion source for generating an ion beam, an end station for holding a substrate to be implanted by the ion beam, and a linear accelerator disposed between the ion source and the end station and adapted to accelerate the ion beam, the linear accelerator comprising at least one acceleration stage including a resonator coil coupled to a drift tube assembly, the drift tube assembly including a first drift tube coupled to a first end of a first insulting rod via interference fit, a second drift tube coupled to a first end of a second insulting rod via interference fit, and a mounting bracket coupled to a second end of the first insulting rod and to a second end of the second insulting rod via interference fit.

21 Claims, 4 Drawing Sheets

METHOD OF ASSEMBLING DRIFT TUBE ASSEMBLIES IN ION IMPLANTORS

FIELD OF THE DISCLOSURE

The present disclosure relates generally to high-energy ion implanters and, more particularly, to a method of assembling drift tube assemblies in linear accelerators of ion implanters.

BACKGROUND OF THE DISCLOSURE

Ion implantation is a process of introducing dopants or impurities into a substrate via bombardment. Ion implantation systems include an ion source and a series of beam-line components. The ion source incudes a chamber where ions are generated. The ion source may also include a power source and an extraction electrode assembly disposed near the chamber. The beam-line components may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or an ion beam having particular species, shape, energy, and/or other qualities. The ion beam passes through the beam-line components and may be directed toward a substrate mounted on a platen or clamp.

Implantation apparatuses capable of generating ion energies of approximately 1 MeV or greater are often referred to as high-energy ion implanters, or high-energy ion implantation systems. One type of high-energy ion implanter is a linear accelerator, or LINAC, in which a series of electrodes arranged as tubes (sometimes referred to as "drift tubes") conduct and accelerate the ion beam to increasingly higher energy along the succession of tubes, where the electrodes receive an AC voltage signal. The drift tubes are typically connected to the ends of electrically insulating rods which are in-turn connected to a mounting bracket that facilitates installation within a LINAC. Mechanical fasteners (e.g., screws, pins, friction washers, etc.) are typically used to connect the drift tubes to the insulating rods and to connect the insulating rods to the mounting bracket. However, such fasteners generally do not provide a strong enough connection to resist external forces that can twist or translate the drift tubes out of their nominal precise positions and orientations. Moreover, mechanical fasteners provide relatively weak thermal coupling between the drift tubes, the insulating rods, and the mounting bracket, which may compromise cooling of the electrodes.

With respect to these and other considerations, the present disclosure is provided.

SUMMARY OF THE DISCLOSURE

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

A ion implantation system according to embodiments of the present disclosure include an ion source for generating an ion beam, an end station for holding a substrate to be implanted by the ion beam, and a linear accelerator disposed between the ion source and the end station and adapted to accelerate the ion beam, the linear accelerator comprising at least one acceleration stage including a resonator coil coupled to a drift tube assembly, the drift tube assembly including a first drift tube coupled to a first end of a first insulting rod via interference fit, a second drift tube coupled to a first end of a second insulting rod via interference fit, and a mounting bracket coupled to a second end of the first insulting rod and to a second end of the second insulting rod via interference fit.

A drift tube assembly according to embodiments of the present disclosure include a first drift tube coupled to a first end of a first insulting rod via interference fit, a second drift tube coupled to a first end of a second insulting rod via interference fit, and a mounting bracket coupled to a second end of the first insulting rod and to a second end of the second insulting rod via interference fit.

A method of assembling a drift tube assembly in accordance with the present disclosure includes providing a first drift tube, a second drift tube, and a mounting bracket formed of electrically and thermally conductive materials, providing a first insulating rod and a second insulating rod formed of an electrically and thermally insulating material, heating the first drift tube and the second drift tube, inserting a first end of the first insulating rod into a mounting hole of the first drift tube and inserting a first end of the second insulating rod into a mounting hole of the second drift tube, cooling the first drift tube and the second drift tube to produce an interference fit between the first drift tube and the first insulating rod and between the second drift tube and the second insulating rod, heating the mounting bracket, inserting a second end of the first insulating rod into a first mounting hole of the mounting bracket and inserting a second end of the second insulating rod into a second mounting hole of the mounting bracket, and cooling the mounting bracket to produce an interference fit between the mounting bracket and the first insulating rod and between the mounting bracket and the second insulating rod.

BRIEF DESCRIPTION OF THE DRAWINGS

The accompanying drawings illustrate exemplary approaches of the disclosure, including the practical application of the principles thereof, as follows.

Figure 1:
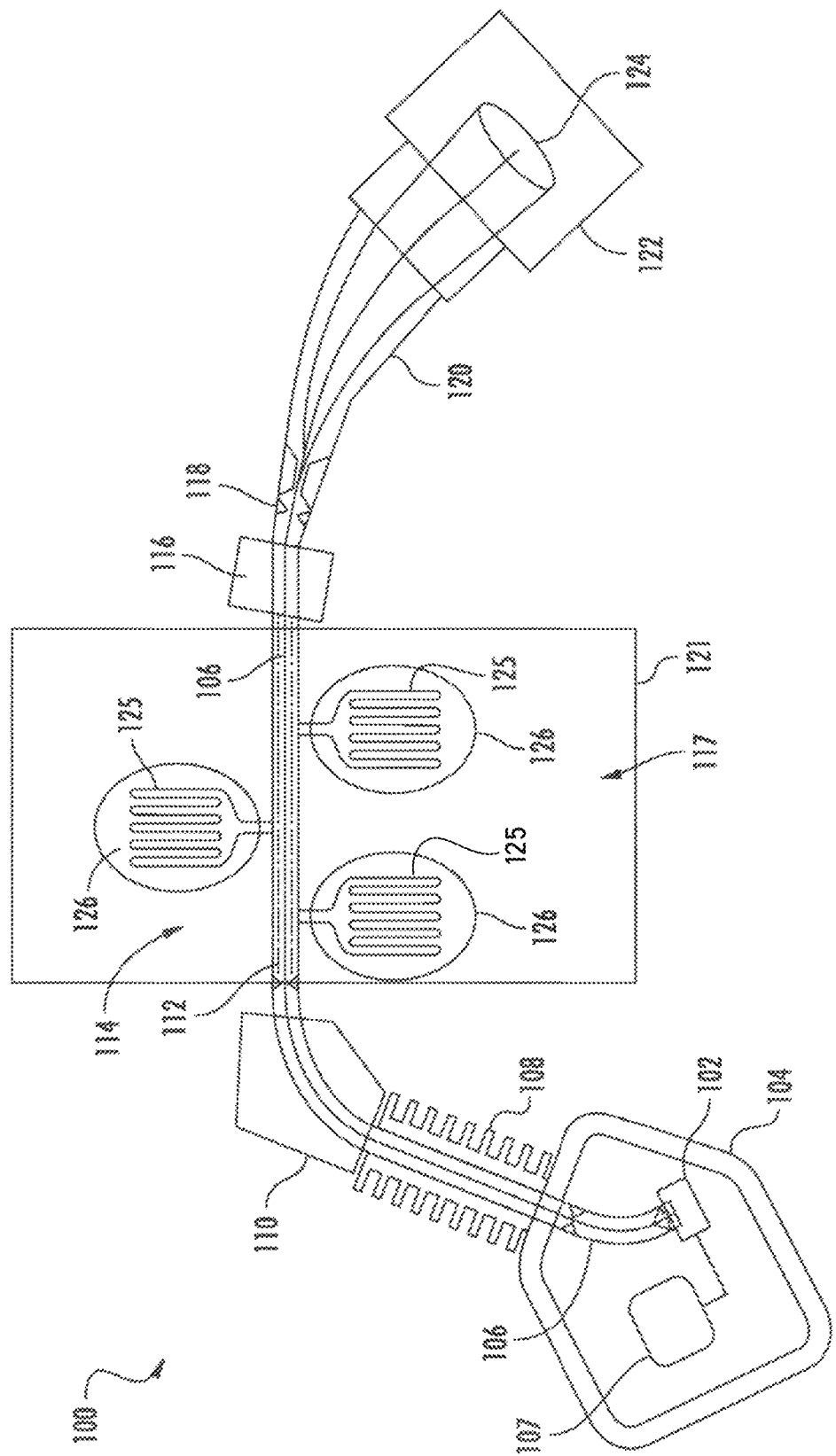
FIG. 1 is a schematic view illustrating an ion implanter in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Ion implanters, linear accelerators, and associated components and methods in accordance with the present disclosure will now be described more fully hereinafter with reference to the accompanying drawings, where embodiments of the ion implanters, linear accelerators, and associated components and methods are shown. The ion implanters, linear accelerators, and associated components and methods may be embodied in many different forms and are not to be construed as being limited to the embodiments set forth herein. Instead, these embodiments are provided so this disclosure will be thorough and complete, and will fully convey the scope of the disclosure to those skilled in the art.

Provided herein is an improved high-energy ion implantation system, which may also be referred to herein as an "ion implanter" for the sake of brevity. Various embodiments provide novel configurations for generating high-energy ions, where the final ion energy delivered to a substrate may be 1 MeV or greater. One aspect of embodiments of the present disclosure is a novel LINAC assembly, providing various advantages over known beamline architectures, including improved coupling between various components.

Referring now to FIG. 1, an exemplary ion implanter (hereinafter "implanter") 100 is shown in block form. The implanter 100 may represent a beamline ion implanter, with some elements not shown for clarity of explanation. The implanter 100 may include an ion source 102 and a gas box 107 disposed in a terminal 104. The ion source 102 may include an extraction system including extraction components and filters (not shown) to generate an ion beam 106 at a first energy. Although non-limiting, the first ion energy may range from 5 keV to 100 keV. The implanter 100 may further include a DC accelerator column 108, disposed downstream of the ion source 102. The DC accelerator column 108 is operable to accelerate the ion beam 106 to a second ion energy, where the second ion energy is greater than the first ion energy.

The implanter 100 may further include an analyzer 110 operable to analyze the accelerated ion beam 106, for example, by changing the trajectory of the ion beam 106. In some embodiments, the implanter 100 may also include a buncher 112 and a linear accelerator assembly 114 within a chamber 117 (e.g., vacuum chamber) of a housing 121, the linear accelerator assembly 114 disposed downstream of the DC accelerator column 108 and the analyzer 110. During use, the linear accelerator assembly 114 is operable to accelerate the ion beam 106 to a third energy, greater than the second energy.

The linear accelerator assembly 114 may include a plurality of accelerator stages 126, each including one or more coils 125, as will be further described herein. In some embodiments, the accelerator stages 126 of the linear accelerator assembly 114 may be single gap accelerator stages, while in other embodiments the accelerator stages 126 may be double gap or triple gap accelerator stages. In particular embodiments, the linear accelerator assembly 114 may include at least three single gap accelerator stages. Embodiments are not limited in this context, however. In various embodiments, the implanter 100 may include additional components, such as filter magnet 116, a scanner 118, and a collimator 120, which together deliver high-energy ion beam 106 to an end station 122 for processing a substrate 124.

Figure 2:
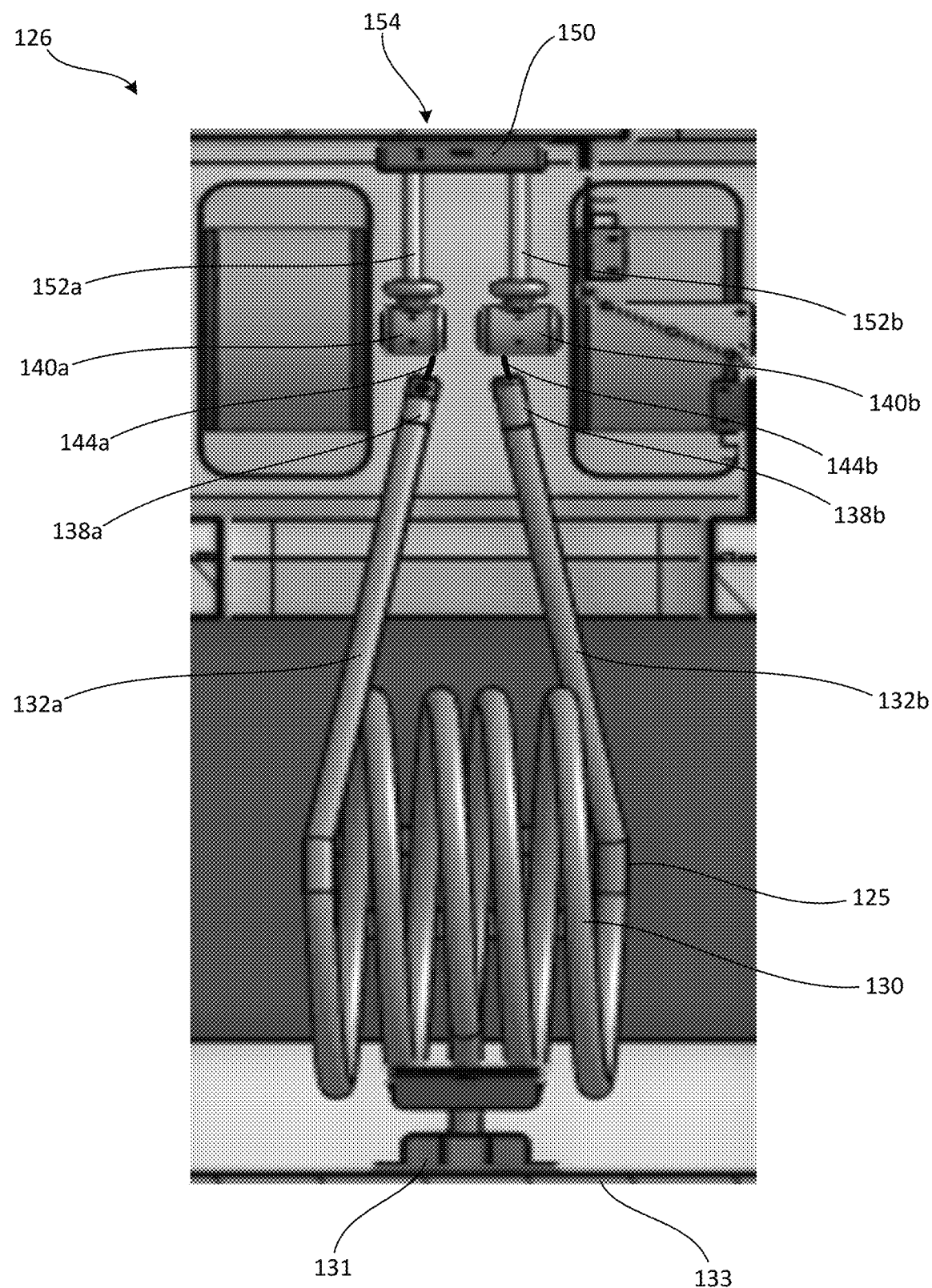
FIG. 2 is side view illustrating an acceleration stage of a LINAC in accordance with embodiments of the present disclosure.

Referring to FIG. 2, a detailed view illustrating one of the accelerator stages 126 of the linear accelerator assembly 114 according to embodiments of the present disclosure is shown. The accelerator stage 126 may include the coil 125, which may be a coil of an RF coil resonator. The coil 125 may include a toroidal or helical section 130 secured by one or more helical supports 131. The helical support 131 may be coupled to a wall 133 of the housing 121 of the chamber 117 (FIG. 1). Extending from the helical section 130 are first and second inductive coupling arms 132a, 132b (hereinafter "the first and second arms 132a, 132b"). As shown, the first and second arms 132a, 132b extend from opposite ends of the helical section 130. Although non-limiting, the coil 125 may be made of hollow tubing with an approximately circular cross section. In some embodiments, the coil 125 is a copper tube defining an internal channel to permit a cooling fluid to flow therethrough. For example, internally flowing water within the coil 125 may help dissipate heat generated by current traveling along the conductive material of the coil 125. The present disclosure is not limited in this regard.

The first and second arms 132a, 132b may have respective free ends 138a, 138b coupled to respective first and second drift tubes 140a, 140b by respective first and second leads 144a, 144b. As used herein, the term "drift tube" may indicate a cavity or region of a beamline surrounded by a conductor at a controlled potential so no electric fields penetrate into the interiors of the first and second drift tubes 140a, 140b, but the electric fields are confined to the entrance and exit regions of the first and second drift tubes 140a, 140b. Thus, charged particles will travel at a constant speed or "drift" through the first and second drift tubes 140a, 140b. A high frequency generator may generate a radio frequency signal, such as 20 MHz or greater, and in some embodiments, may generate a 40 MHz signal. The present disclosure is not limited in this regard. The linear accelerator assembly 114 may be configured as a step-up transformer to act as a voltage source to generate a high voltage, high frequency signal, such as a radio frequency voltage signal. This high voltage signal is used to control the voltage of the first and second drift tubes 140a, 140b and thus define the acceleration provided by the accelerator stage 126.

The first and second leads 144a, 144b may be flexible connectors (e.g., wires, ribbons, tubes, tapes, bands, etc.) formed of conductive material operable to provide electrical and thermal coupling between the first and second arms 132a, 132b and the first and second drift tubes 140a, 140b, respectively. In various embodiments, the first and second leads 144a, 144b may be formed of electrically pure copper or, for example, a tungsten-copper alloy. In some embodiments, the first and second leads 144a, 144b may include a coating such as copper or silver and/or a protective coating, such as carbon. The present disclosure is not limited in this regard.

The first and second drift tubes 140a, 140b may be coupled to a mounting bracket 150 by first and second insulating rods 152a, 152b, respectively. The first and second drift tubes 140a, 140b, the first and second insulating rods 152a, 152b, and the mounting bracket 150 are collectively referred to hereinafter as "the drift tube assembly 154." The mounting bracket 150 may be coupled to the wall of the chamber 117 with mechanical fasteners (e.g., bolts, screws, etc.). In various embodiments, the first and second drift tubes 140a, 140b and the mounting bracket 150 may be formed of an electrically and thermally conductive material, such as aluminum, titanium, or other metals. The first and second drift tubes 140a, 140b and the mounting bracket 150 may be formed of the same material or different materials. The first and second insulating rods 152a, 152b may be formed of an electrically and thermally insulating material, such as alumina or quartz. The present disclosure is not limited in this regard.

Figure 3:
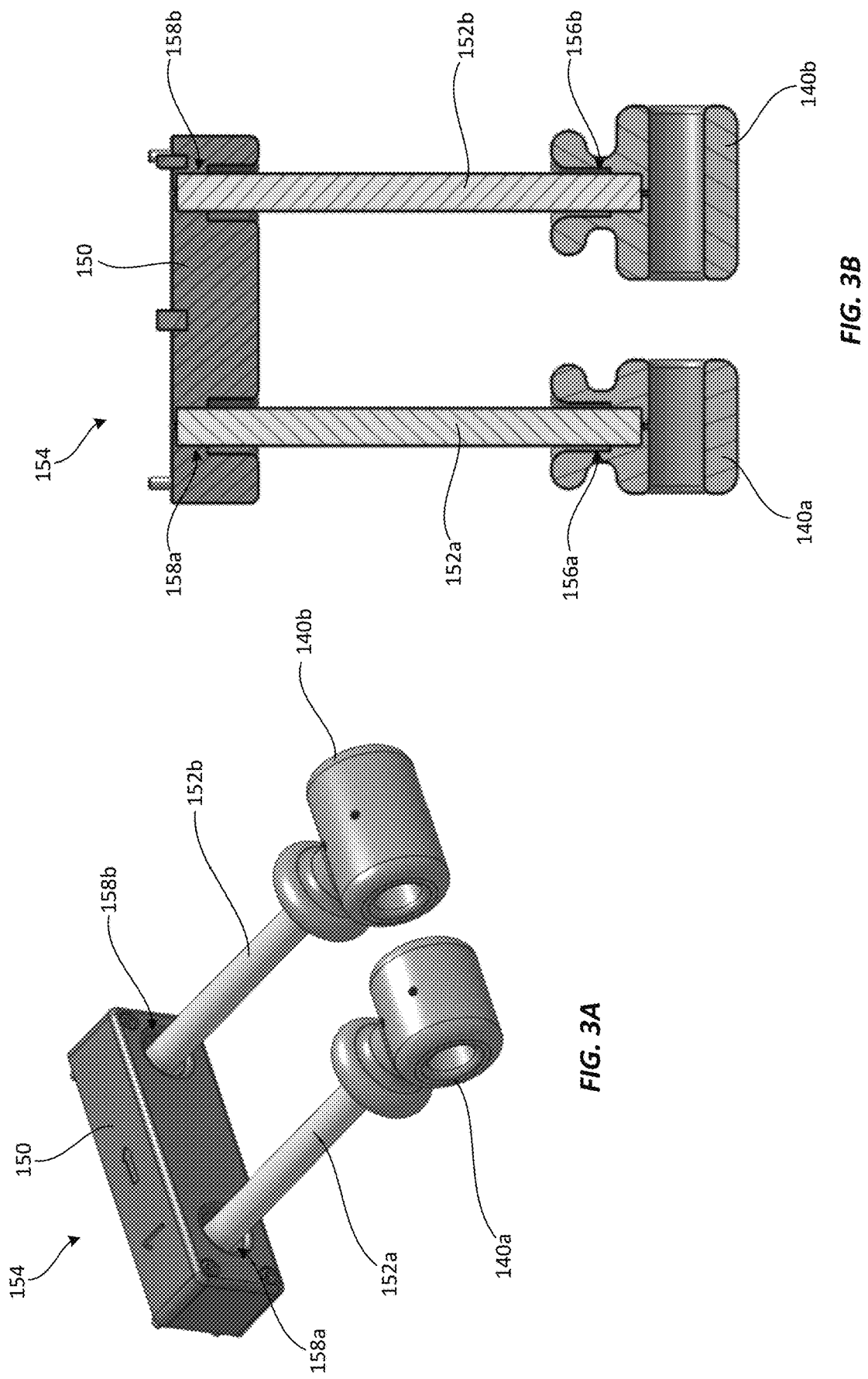
FIG. 3A is a perspective view illustrating a drift tube assembly in accordance with embodiments of the present disclosure.
FIG. 3B is a cross-sectional view illustrating the drift tube assembly shown in FIG. 3A.

Referring now to FIGS. 3A and 3B, a perspective view and a cross-sectional view illustrating the drift tube assembly 154 in isolation are shown. The first and second insulating rods 152a, 152b may be coupled to the mounting bracket 150 and to the respective first and second drift tubes 140a, 140b via interference fit, such as may be achieved using a thermal shrink fitting process as further described below. Specifically, a first end of the first insulating rod 152a may be disposed within a mounting hole 156a in the first drift tube 140a and may be secured therein by an interference fit between the first insulating rod 152a and the first drift tube 140a, and a second end of the first insulating rod 152a may be disposed within a mounting hole 158a in the mounting bracket 150 and may be securely held therein by an interference fit between the first insulating rod 152a and the mounting bracket 150. Similarly, a first end of the second insulating rod 152b may be disposed within a mounting hole 156b in the second drift tube 140b and may be securely held therein by an interference fit between the second insulating rod 152b and the second drift tube 140b, and a second end of the second insulating rod 152b may be disposed within a mounting hole 158b in the mounting bracket 150 and may be secured therein by an interference fit between the second insulating rod 152b and the mounting bracket 150. The first and second insulating rods 152a, 152b may be cylindrical and the mounting holes 156a, 156b, 158a, and 158b may be round as depicted in FIGS. 3A and 3B. The present disclosure is not limited in this regard, and alternative embodiments are contemplated wherein the first and second insulating rods 152a, 152b and the mounting holes 156a, 156b, 158a, 158b have different cross-sectional shapes, such as rectangular, triangular, irregular, etc.

The interference fits between the first and second insulating rods 152a, 152b, the first and second drift tubes 140a, 140b, and the mounting bracket 150 (established via thermal shrink fitting as further described below) provide a simple method of attachment that does not require the use of mechanical fasteners such as screws, pins, friction washers, etc. as are typically implemented in conventional drift tube assembly constructions. Additionally, thermal shrink fitting produces strong joints (i.e., stronger than those achieved using traditional mechanical fasteners) capable of resisting external forces which could otherwise twist or translate the first and second drift tubes 140a, 140b out of their nominal, precise positions and orientations. Still further, thermal shrink fitting produces a superior thermal interface relative to traditional mechanical fasteners and thus provides superior thermal conductivity for cooling the first and second drift tubes 140a, 140b.

The drift tube assembly 154 is shown and described herein as having two drifts tubes and two corresponding insulating rods coupling the drift tubes to a mounting bracket via interference fit. This configuration is provided by way of example only and is not intended to be limiting. Alternative embodiments of the present disclosure are contemplated wherein the drift tube assembly 154 is provided with a greater number of drift tubes and corresponding insulating rods coupled to one or more mounting brackets as may be appropriate for a particular application.

Figure 4:
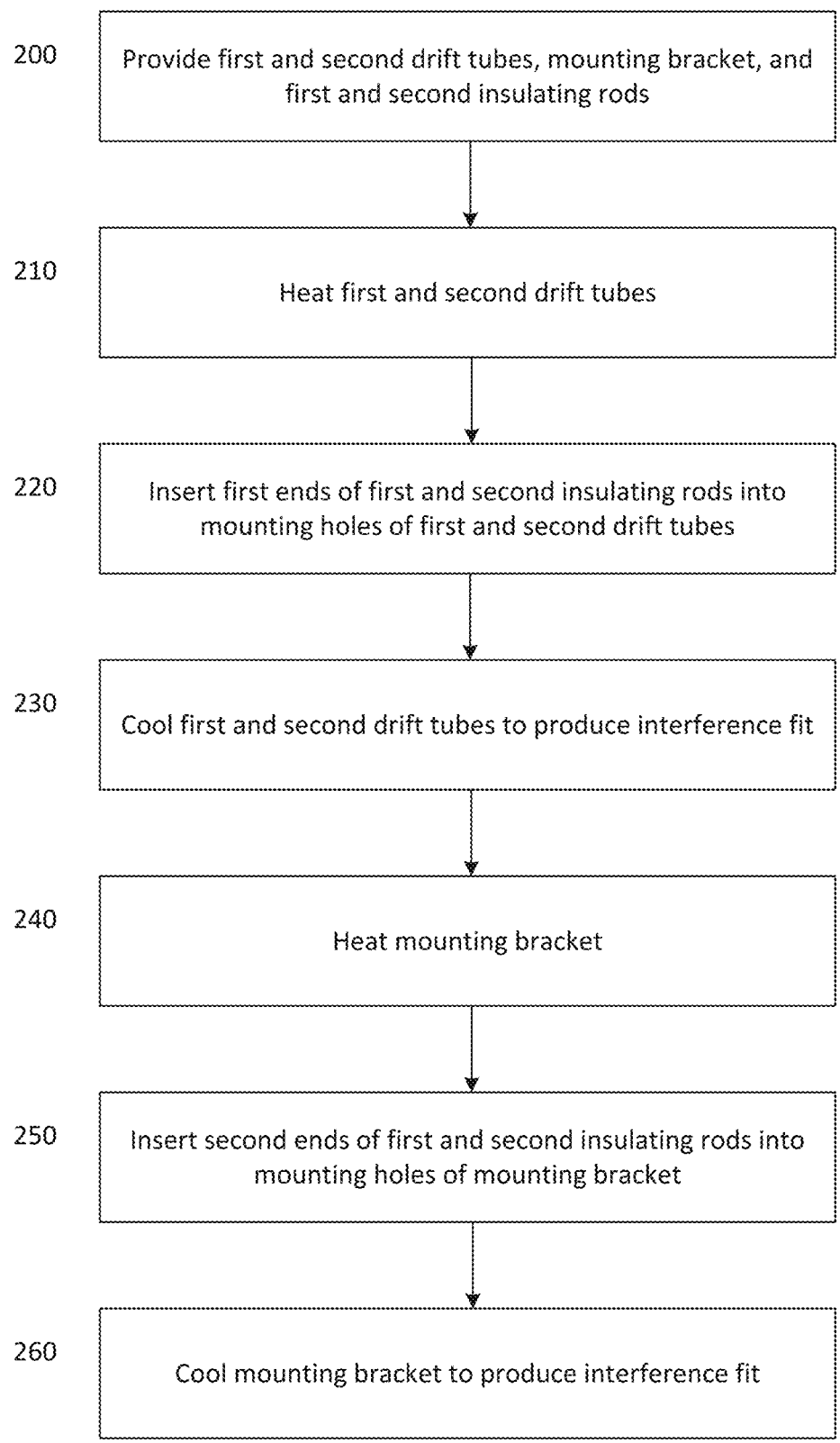
FIG. 4 is a flow diagram illustrating a method of assembling a drift tube assembly in accordance with embodiments of the present disclosure.

Referring to FIG. 4, a flow diagram illustrating an exemplary method of assembling the above-described drift tube assembly 154 in accordance with the present disclosure is shown. The method will now be described in conjunction with the illustrations of the drift tube assembly 154 shown in FIGS. 3A and 3B.

At block 200 of the exemplary method, the first and second drift tubes 140a, 140b, the mounting bracket 150, and the first and second insulating rods 152a, 152b may be provided. In various embodiments, the first and second drift tubes 140a, 140b and the mounting bracket 150 may be formed of an electrically and thermally conductive material, such as aluminum, titanium, or other metals. The first and second drift tubes 140a, 140b and the mounting bracket 150 may be formed of the same material or different materials. The first and second insulating rods 152a, 152b may be formed of an electrically and thermally insulting material, such as alumina or quartz. The present disclosure is not limited in this regard. The first and second drift tubes 140a, 140a may have respective first and second mounting holes 156a, 156b formed therein, and the mounting bracket 150 may have first and second mounting holes 158a, 158b formed therein. The mounting holes 156a, 156b, 158a, and 158b may have diameters smaller than the diameters of the first and second insulating rods 152a, 152b at room temperature. "Room temperature" is defined herein to mean a temperature in a range of about 10 degrees Celsius to about 30 degrees Celsius. In a non-limiting example, the first and second insulating rods 152a, 152b may have diameters in a range of 10 millimeters to 20 millimeters. In a non-limiting example, the mounting holes 156a, 156b, 158a, 158b may have diameters that are equal to or slightly smaller than the diameters of the first and second insulating rods 152a, 152b at room temperature.

At block 210 of the exemplary method, the first and second drift tubes 140a, 140b may be heated to a temperature in a range of 150 degrees Celsius to 350 degrees Celsius, causing the first and second drift tubes 140a, 140b and the first and second mounting holes 156a, 156b to expand in size. Specifically, the diameters of the first and second mounting holes 156a, 156b may expand to be larger than the diameters of the first and second insulating rods 152a, 152b. In various embodiments, the first and second drift tubes 140a, 140b may be heated using any suitable method, including, and not limited to, an electric resistive hot plate, an oven, a heat shrink gun, heat lamps, etc. At block 220 of the method, first ends of the first and second insulating rods 152a, 152b may be inserted into the expanded first and second mounting holes 156a, 156b of the first and second drift tubes 140a, 140a, respectively, with the first and second drift tubes 140a, 140b oriented in a desired manner relative to the first and second insulating rods 152a, 152b. In various embodiments, the first and second drift tubes 140a, 140b and the first and second insulating rods 152a, 152b may be aligned using precision jigs (not shown).

At block 230 of the exemplary method, the first and second drift tubes 140a, 140b may be cooled to room temperature or below, causing the first and second drift tubes 140a, 140b and the first and second mounting holes 156a, 156b to shrink back to their normal, room temperature sizes. In various embodiments, the first and second drift tubes 140a, 140b may be cooled using any suitable method, including, and not limited to, passive convective cooling, active convective cooling (e.g., using a fan), and evaporative cooling (e.g., spraying with water). The first and second mounting holes 156a, 156b thus shrink around the first and second insulating rods 152a, 152b, establishing interference fits therebetween to provide tight, compressive joints that resist relative rotation between the first and second drift tubes 140a, 140b and the first and second insulating rods 152a, 152b. In non-limiting embodiments, the diametric interference at the joints may be in a range of 0.00010 inches to 0.0030 inches (i.e., the shrunken first and second mounting holes 156a, 156b may diametrically compress the portions of the first and second insulating rods 152a, 152b disposed therein by about 0.00010 inches to about 0.0030 inches). These joints remain tight at temperatures exceeding normal operating temperatures of the first and second drift tubes 140a, 140b and the first and second insulating rods 152a, 152b.

At block 240 of the exemplary method, the mounting bracket 150 may be heated to a temperature in a range of 150 degrees Celsius to 350 degrees Celsius, causing the mounting bracket 150 and the first and second mounting holes 158a, 158b to expand in size. Specifically, the diameters of the first and second mounting holes 158a, 158b may expand to be larger than the diameters of the first and second insulating rods 152a, 152b. In various embodiments, the mounting bracket 150 may be heated using any suitable method, including, and not limited to, an electric resistive hot plate, an oven, a heat shrink gun, heat lamps, etc. The mounting bracket 150 may be heated at the same time and using the same method as the first and second drift tubes 140a, 140b (as in block 210 described above) or may be heated at a different time and/or using a different method. The present disclosure is not limited in this regard.

At block 250 of the method, second ends of the first and second insulating rods 152a, 152b may be inserted into the expanded first and second mounting holes 158a, 158b of the mounting bracket 150, respectively, with the first and second insulating rods 152a, 152b (and the attached first and second drift tubes 140a, 140b) oriented in a desired manner relative to the mounting bracket 150. In various embodiments, the first and second insulating rods 152a, 152b and the mounting bracket 150 may be aligned using precision jigs (not shown).

At block 260 of the exemplary method, the mounting bracket 150 may be cooled to room temperature or below, causing the mounting bracket 150 and the first and second mounting holes 158a, 158b to shrink back to their normal, room temperature sizes. In various embodiments, the mounting bracket 150 may be cooled using any suitable method, including, and not limited to, passive convective cooling, active convective cooling (e.g., using a fan), and evaporative cooling (e.g., spraying with water). The first and second mounting holes 158a, 158b thus shrink around the first and second insulating rods 152a, 152b, establishing interference fits therebetween to provide tight, compressive joints that resist relative rotation between the mounting bracket 150 and the first and second insulating rods 152a, 152b. In non-limiting embodiments, the diametric interference at the joints may be in a range of 0.00010 inches to 0.0030 inches (i.e., the shrunken first and second mounting holes 158a, 158b may diametrically compress the portions of the first and second insulating rods 152a, 152b disposed therein by about 0.00010 inches to about 0.0030 inches). These joints remain tight at temperatures exceeding normal operating temperatures of the mounting bracket 150 and the first and second insulating rods 152a, 152b.

In sum, the embodiments of the present disclosure described above provide a drift tube assembly that does not require mechanical fasteners such as screws, pins, friction washers, etc. as are typically implemented in conventional drift tube assembly constructions. Additionally, the above-described thermal shrink fitting process produces strong joints (i.e., stronger than those achieved using traditional mechanical fasteners) capable of resisting external forces which could otherwise twist or translate the first and second drift tubes 140a, 140b out of their nominal, precise positions and orientations. Still further, the above-described thermal shrink fitting process produces a superior thermal interface relative to traditional mechanical fasteners and thus provides superior thermal conductivity for cooling the first and second drift tubes 140a, 140b. Still further, the above-described thermal shrink fitting process provides a highly reliable, highly repeatable method of assembling drift tube assemblies with superior precision relative to conventional drift tube assemblies that employ mechanical fasteners.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Furthermore, identification references (e.g., primary, secondary, first, second, third, fourth, etc.) are not intended to connote importance or priority but are used to distinguish one feature from another.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An ion implantation system comprising:
   an ion source for generating an ion beam;
   an end station for holding a substrate to be implanted by the ion beam; and
   a linear accelerator disposed between the ion source and the end station and adapted to accelerate the ion beam, the linear accelerator comprising at least one acceleration stage including a resonator coil coupled to a drift tube assembly, the drift tube assembly comprising:
- a first drift tube coupled to a first end of a first insulting rod via interference fit;
- a second drift tube coupled to a first end of a second insulting rod via interference fit; and
- a mounting bracket coupled to a second end of the first insulting rod and to a second end of the second insulting rod via interference fit.

2. The ion implantation system of claim 1, wherein the first drift tube, the second drift tube, and the mounting bracket are formed of one of aluminum and titanium.

3. The ion implantation system of claim 1, wherein the first insulating rod and the second insulating rod are formed of one of alumina and quartz.

4. The ion implantation system of claim 1, wherein the first end of first insulating rod extends into a mounting hole in the first drift tube, the mounting hole having a diameter equal to or smaller than a diameter of the first insulating rod at room temperature.

5. The ion implantation system of claim 4, wherein a diametric interference between the mounting hole in the first drift tube and the first insulating rod is in a range of 0.00010 inches to 0.0030 inches.

6. The ion implantation system of claim 1, wherein the second end of first insulating rod extends into a mounting hole in the mounting bracket, the mounting hole having a diameter equal to or smaller than a diameter of the first insulating rod at room temperature.

7. The ion implantation system of claim 6, wherein a diametric interference between the mounting hole in the mounting bracket and the first insulating rod is in a range of 0.00010 inches to 0.0030 inches.

8. A drift tube assembly for an ion implantation system, the drift tube assembly comprising:
- a first drift tube coupled to a first end of a first insulting rod via interference fit;
- a second drift tube coupled to a first end of a second insulting rod via interference fit; and
- a mounting bracket coupled to a second end of the first insulting rod and to a second end of the second insulting rod via interference fit.

9. The drift tube assembly of claim 8, wherein the first drift tube, the second drift tube, and the mounting bracket are formed of one of aluminum and titanium.

10. The drift tube assembly of claim 8, wherein the first insulating rod and the second insulating rod are formed of one of alumina and quartz.

11. The drift tube assembly of claim 8, wherein the first end of first insulating rod extends into a mounting hole in the first drift tube, the mounting hole having a diameter equal to or smaller than a diameter of the first insulating rod at room temperature.

12. The drift tube assembly of claim 11, wherein a diametric interference between the mounting hole in the first drift tube and the first insulating rod is in a range of 0.00010 inches to 0.0030 inches.

13. The drift tube assembly of claim 8, wherein the second end of first insulating rod extends into a mounting hole in the mounting bracket, the mounting hole having a diameter equal to or smaller than a diameter of the first insulating rod at room temperature.

14. The drift tube assembly of claim 13, wherein a diametric interference between the mounting hole in the mounting bracket and the first insulating rod is in a range of 0.00010 inches to 0.0030 inches.

15. A method of assembling a drift tube assembly, the method comprising:
- providing a first drift tube, a second drift tube, and a mounting bracket formed of electrically and thermally conductive materials;
- providing a first insulating rod and a second insulating rod formed of an electrically and thermally insulating material;
- heating the first drift tube and the second drift tube;
- inserting a first end of the first insulating rod into a mounting hole of the first drift tube and inserting a first end of the second insulating rod into a mounting hole of the second drift tube;
- cooling the first drift tube and the second drift tube to produce an interference fit between the first drift tube and the first insulating rod and between the second drift tube and the second insulating rod;
- heating the mounting bracket;
- inserting a second end of the first insulating rod into a first mounting hole of the mounting bracket and inserting a second end of the second insulating rod into a second mounting hole of the mounting bracket; and
- cooling the mounting bracket to produce an interference fit between the mounting bracket and the first insulating rod and between the mounting bracket and the second insulating rod.

16. The method of claim 15, wherein the first drift tube, the second drift tube, and the mounting bracket are formed of one of aluminum and titanium.

17. The method of claim 15, wherein the first insulating rod and the second insulating rod are formed of one of alumina and quartz.

18. The method of claim 15, wherein the first insulating rod and the second insulating rod are heated to a temperature in a range of 150 degrees Celsius to 350 degrees Celsius.

19. The method of claim 15, wherein the mounting bracket is heated to a temperature in a range of 150 degrees Celsius to 350 degrees Celsius.

20. The method of claim 15, wherein a diametric interference between the mounting hole in the first drift tube and the first insulating rod is in a range of 0.00010 inches to 0.0030 inches.

21. The method of claim 15, wherein a diametric interference between the first mounting hole in the mounting bracket and the first insulating rod is in a range of 0.00010 inches to 0.0030 inches.

* * * * *